(12) United States Patent
Uejima

(10) Patent No.: US 7,889,687 B2
(45) Date of Patent: Feb. 15, 2011

(54) HIGH-FREQUENCY COMPONENT

(75) Inventor: Takanori Uejima, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 90 days.

(21) Appl. No.: 12/502,287

(22) Filed: Jul. 14, 2009

(65) Prior Publication Data

US 2009/0268647 A1 Oct. 29, 2009

Related U.S. Application Data

(63) Continuation of application No. PCT/JP2008/050601, filed on Jan. 18, 2008.

(30) Foreign Application Priority Data

Jan. 19, 2007 (JP) .............................. 2007-010753

(51) Int. Cl.
*H04B 7/00* (2006.01)
(52) U.S. Cl. .................................................. 370/310
(58) Field of Classification Search ................ 370/310, 370/328, 339; 333/32, 100, 101, 132, 133; 455/150, 160, 176
See application file for complete search history.

(56) References Cited

U.S. PATENT DOCUMENTS

| | | | |
|---|---|---|---|
| 6,445,262 B1 | 9/2002 | Tanaka et al. | |
| 6,586,786 B2* | 7/2003 | Kitazawa et al. | 257/275 |
| 6,816,032 B1* | 11/2004 | Gaynor et al. | 333/175 |
| 6,856,213 B2* | 2/2005 | Tsurunari et al. | 333/133 |
| 6,861,924 B2* | 3/2005 | Machui | 333/133 |
| 6,895,228 B2* | 5/2005 | Satoh | 455/168.1 |
| 7,049,906 B2* | 5/2006 | Wilcox | 333/126 |
| 7,057,472 B2* | 6/2006 | Fukamachi et al. | 333/101 |
| 7,253,702 B2* | 8/2007 | Kemmochi et al. | 333/133 |
| 7,356,349 B2* | 4/2008 | Furutani et al. | 455/552.1 |

(Continued)

FOREIGN PATENT DOCUMENTS

JP 2001-168670 A 6/2001

(Continued)

OTHER PUBLICATIONS

Official Communication issued in International Patent Application No. PCT/JP2008/050601, mailed on Mar. 25, 2008.

*Primary Examiner*—Dmitry H Levitan
(74) *Attorney, Agent, or Firm*—Keating & Bennett, LLP

(57) ABSTRACT

A high-frequency component in which a low-frequency-band transmission characteristic is not degraded even when impedance mismatching is generated by providing a SAW filter in a high-frequency-band circuit. The high-frequency component includes a diplexer having a high pass filter and a low pass filter connected in parallel to an antenna port, a high-frequency-band circuit serially connected to the high pass filter, and a low-frequency-band circuit serially connected to the low pass filter. A filter causing impedance mismatching is connected to the high-frequency-band circuit. The high pass filter includes a first series resonant circuit and a second series resonant circuit, and the resonance frequency of the first series resonant circuit is a trap frequency of a signal in the low-frequency band, and the resonance frequency of the second series resonant circuit is a trap frequency of undesired resonance generated in the transmission characteristic of the filter of the low-frequency-band side.

7 Claims, 11 Drawing Sheets

U.S. PATENT DOCUMENTS

| | | | |
|---|---|---|---|
| 7,606,184 B2 * | 10/2009 | Liu et al. | 370/297 |
| 2003/0092397 A1 * | 5/2003 | Uriu et al. | 455/82 |
| 2004/0248539 A1 | 12/2004 | Furutani et al. | |
| 2009/0034504 A1 * | 2/2009 | Uejima | 370/343 |

FOREIGN PATENT DOCUMENTS

| | | |
|---|---|---|
| JP | 2004-094410 A | 3/2004 |
| JP | 2006-148975 A | 6/2006 |

* cited by examiner (18)

(21)

(19)

HIGH-FREQUENCY COMPONENT

BACKGROUND OF THE INVENTION

1. Field of the Invention

The present invention relates to a high-frequency component that can be utilized in a plurality of mobile communications systems.

2. Description of the Related Art

A mobile communication apparatus is available that is capable of performing communication in a plurality of communications systems each having a different frequency band, such as 1800-MHz-band GSM1800 (DCS), 1900-MHz-band GSM1900 (PCS), 850-MHz-band GSM850, and 900-MHz-band GSM900 (EGSM).

Such a mobile communication apparatus utilizes a front-end unit that performs signal splitting and merging for supporting multiple bands, such as quadruple bands compatible with four communications systems, triple bands compatible with three communications systems, and dual bands compatible with two communications systems (see, for example, Japanese Unexamined Patent Application Publication No. 2004-94410).

In general, the front-end unit of such a mobile communication apparatus supporting multiple bands is configured as a module that includes a diplexer connected to an antenna port and a plurality of switching circuits connected to the diplexer in stages subsequent thereto.

For instance, in the front-end unit of a mobile communication apparatus supporting dual bands, a diplexer performs splitting/merging for a transmission/reception signal in the low-frequency band used by EGSM systems (GSM900 and GSM850 systems) etc. and a transmission/reception signal in the high-frequency band used by systems such as DCS or PCS. In a low-frequency-band circuit in a stage subsequent to the diplexer, an EGSM switching circuit performs switching between an EGSM transmission signal and an EGSM reception signal. Similarly, in a high-frequency-band circuit in a stage subsequent to the diplexer, a switching circuit performs switching between a DCS (PCS) transmission signal and a DCS (PCS) reception signal.

In the front-end unit of a mobile communication apparatus that supports triple bands or quadruple bands, for example, the above-described switching circuit is further provided with another switching circuit connected thereto in a subsequent stage for performing, for example, switching between a GSM850 reception signal and a GSM900 reception signal, or switching between a DCS reception signal and a PCS reception signal.

The reception path corresponding to each communications system in such a front-end unit may have an unbalanced-input/balanced-output SAW filter, which passes only a signal-reception band, while removing signals in undesired frequency bands, and amplifies a received signal. This SAW filter prevents a failure of a circuit on the reception path side caused by a signal that leaks from a transmission path to the reception path.

A diplexer, in general, has a circuit configuration in which a high-frequency-band filter and a low-frequency-band filter are connected in parallel to the antenna port.

The high-frequency-band filter may be configured to include a plurality of capacitors connected serially to the antenna port and a series resonant circuit, one end of which is connected to a connection node among the capacitors and the other end of which is grounded. These configuration elements are made to have impedance settings so as to attenuate a transmission/reception signal in the low-frequency band and to pass a transmission/reception signal in the high-frequency band.

To realize a steep attenuation pole, in the cutoff characteristic, for preventing a transmission/reception signal in the low-frequency band from entering the high-frequency-band side, the impedances of the configuration elements of the series resonant circuit of the high-frequency-band filter are set so that the resonant circuit has a resonance frequency that corresponds to the trap frequency of a transmission/reception signal in the low-frequency band (for example, a resonance frequency equal to the specification-defined center frequency of a communications system for the low-frequency band).

The low-frequency-band filter is configured to include a parallel resonant circuit having a line connected to the antenna port and a capacitor connected in parallel to this line and to include a series resonant circuit having a line and a capacitor serially connected to this line. These configuration elements are made to have respective impedance settings so as to attenuate a transmission/reception signal in the high-frequency band and to pass a transmission/reception signal in the low-frequency band.

To realize a steep attenuation pole, in the transmission characteristic, for preventing a transmission/reception signal in the high-frequency band from entering the low-frequency-band side, the respective impedances of the configuration elements of the parallel resonant circuit of the low-frequency-band filter are set so that the resonant circuit has a resonance frequency that corresponds to the trap frequency of a transmission/reception signal in the high-frequency band (for example, a resonance frequency equal to the specification-defined center frequency of a communications system).

When a SAW filter is provided on a reception path of each communications system, impedance matching is not realized in the connection portion of the SAW filter because the impedance of the SAW filter for frequencies outside of the passband is not 50Ω. Hence, there is a problem in that it is necessary, for impedance matching, to provide a phase adjustment circuit in the front-end unit or to provide a multi-stage filter in the diplexer, causing a complicated circuit configuration and a resultant increase in the number of components and size of the module.

If a SAW filter is provided on a reception path of a communications system of the high-frequency band or the low-frequency band without performing impedance matching, the transmission characteristic of the frequency band of one communications system and the cutoff characteristic of the frequency band of the other communications system will be degraded.

SUMMARY OF THE INVENTION

The inventor has invented preferred embodiments of the present invention based on the discovery that when impedance mismatching occurs in the high-frequency-band circuit, resonance that is generated due to a second series resonant circuit of the high-frequency-band filter (high pass filter) influences the passband characteristic of the low-frequency-band side, causing an undesired attenuation pole to be generated in the passband characteristic of the low-frequency-band side when no corrective action is taken.

In view of generation of impedance mismatching observed when a SAW filter is provided in a high-frequency-band circuit, preferred embodiments of the present invention provide a high-frequency component having a simple configuration that prevents degradation of the transmission characteristic of a high-frequency band and the cutoff characteristic of a low-frequency band even with the presence of impedance mismatching.

According to a preferred embodiment of the present invention, a high-frequency component includes a diplexer, a high-frequency-band circuit, and a low-frequency-band circuit.

The diplexer includes a high-frequency-band filter and a low-frequency-band filter connected in parallel to an antenna port. The low-frequency-band filter passes a transmission/reception signal in a low-frequency band and attenuates a transmission/reception signal in a high-frequency band. The high-frequency-band filter passes a transmission/reception signal in the high-frequency band and attenuates a transmission/reception signal in the low-frequency band. The high-frequency-band circuit is serially connected to the high-frequency-band filter of the diplexer, and the low-frequency-band circuit is serially connected to the low-frequency-band filter of the diplexer. The high-frequency-band filter is configured to include a first series resonant circuit and a second series resonant circuit, and one end of the first series resonant circuit is connected to a connection node between the antenna port and the high-frequency-band circuit and the other end is grounded. The second series resonant circuit includes a reactance element connected serially between the antenna port and the high-frequency-band circuit and includes the first series resonant circuit.

A resonance frequency of the first series resonant circuit preferably is a trap frequency of a transmission/reception signal in the low-frequency band, in the frequency characteristic of the high-frequency band. A resonance frequency of the second series resonant circuit is preferably the same or substantially the same as a frequency of a predetermined attenuation pole in the frequency characteristic of the low-frequency band.

In this configuration, by adjusting and setting the resonance frequency of resonance appearing in the second series resonant circuit, a frequency of an undesired attenuation pole generated due to the influence of the second series resonant circuit is preferably made to be the same or substantially the same as a frequency of a predetermined attenuation pole in the low-frequency-band frequency characteristic. Consequently, an undesired attenuation pole is prevented from appearing in the transmission characteristic of the low-frequency side. Therefore, a desired transmission characteristic of the low-frequency band is obtained even when impedance mismatching exists in the high-frequency-band circuit, by using a general configuration as is, for example, a configuration that does not require a phase adjustment circuit or a multistage high pass filter.

Here, the frequency of the predetermined attenuation pole in the low-frequency-band transmission characteristic may preferably be a trap frequency of a transmission/reception signal in the high-frequency band, or a harmonic frequency of a transmission/reception signal in the low-frequency band.

The high-frequency-band circuit may be provided with a mismatching element causing mismatching to be generated, and the mismatching element may be a filter. When the mismatching element is a filter, it is preferable that the resonance frequency of the second series resonant circuit be made to be outside of the passband of the filter.

The high-frequency-band circuit may include a switching circuit arranged to split a transmission/reception signal in the high-frequency band between a transmission signal port and a reception signal port, and a SAW filter connected to the reception signal port of the switching circuit. Further, the high-frequency-band circuit may include a first switching circuit arranged to split a transmission/reception signal in the high-frequency band between a transmission signal port and a reception signal port, a second switching circuit that is connected to the reception signal port of the first switching circuit and that splits the reception signal in the high-frequency band further into reception signals in two frequency bands, and a SAW filter connected to the second switching circuit in a stage subsequent thereto.

Hence, various preferred embodiments of the present invention allow a high-frequency component supporting multiple bands to be configured.

According to preferred embodiments of the present invention, an undesired attenuation pole is removed from a low-frequency-band transmission characteristic, even when impedance matching on a reception path of a high-frequency band is not realized.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
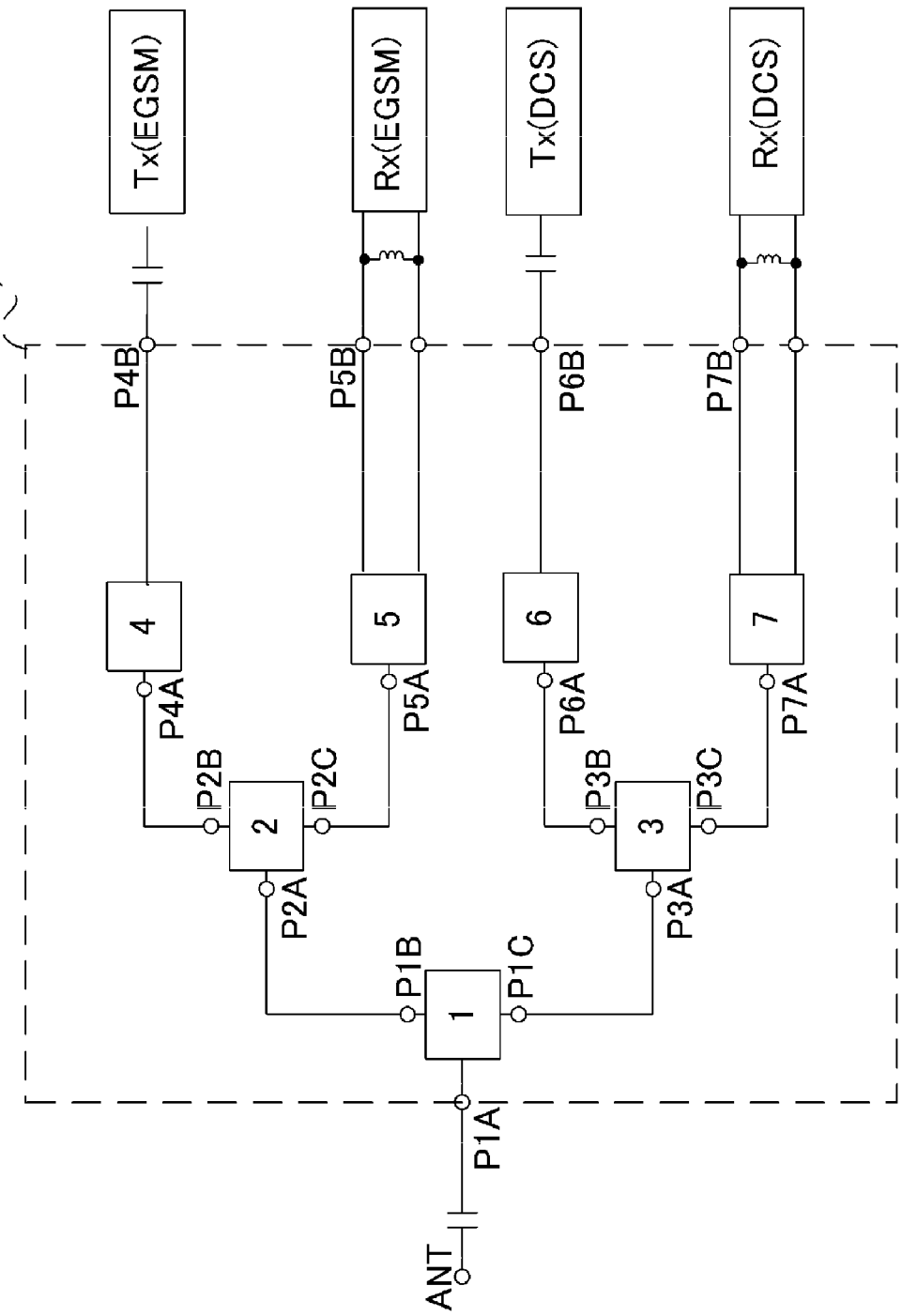
FIG. 1 is a block diagram of a high-frequency component supporting dual bands according to a preferred embodiment of the present invention.
Figure 2:
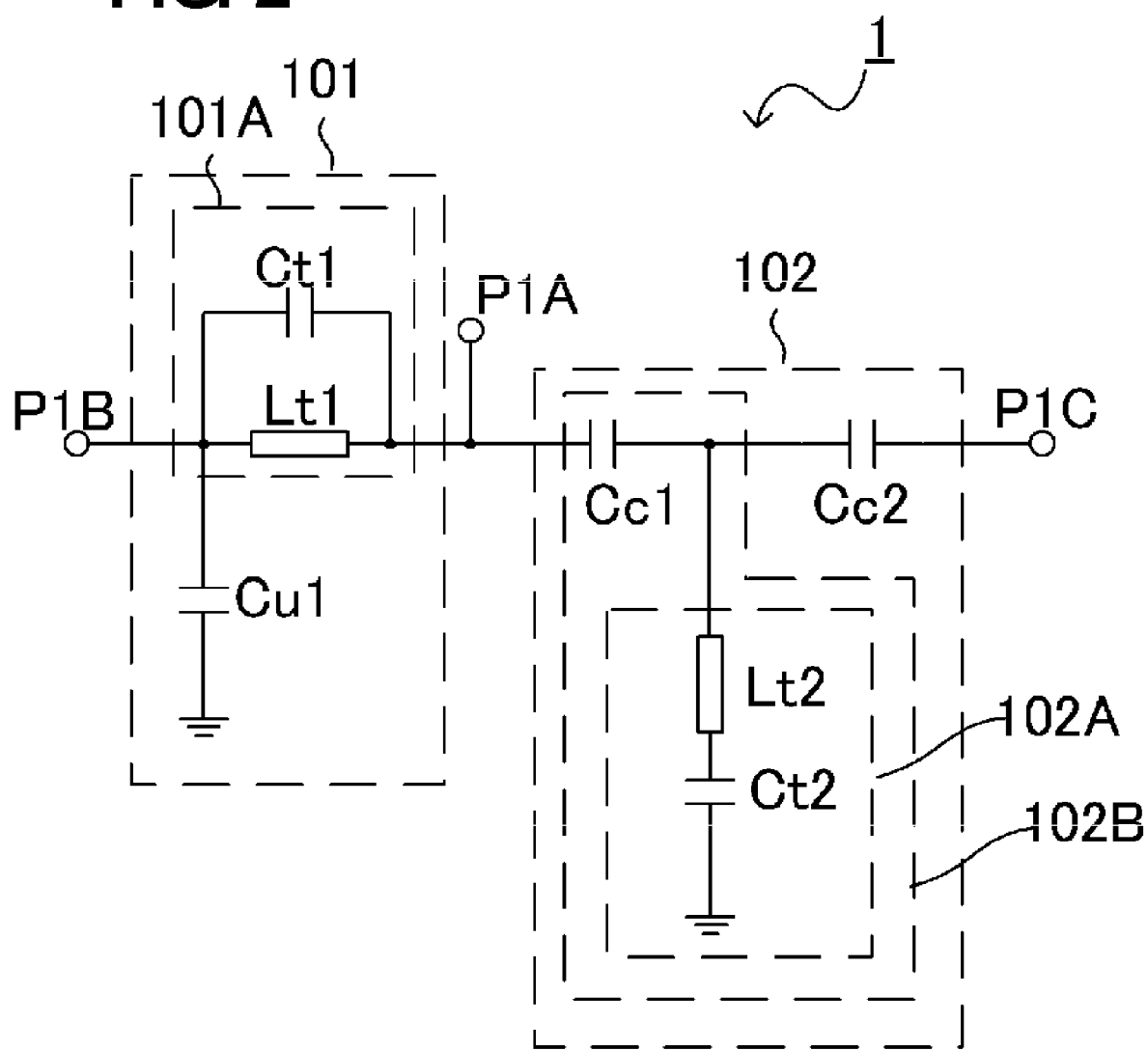
FIG. 2 is a circuit diagram of a diplexer according to a preferred embodiment of the present invention.

A first preferred embodiment of the present invention will be described as a high-frequency component included in a front-end unit of a mobile communication apparatus supporting dual bands of 900-MHz-band EGSM and 1.8-GHz-band DCS, for example. FIG. 1 is a block diagram of a high-frequency component, and FIG. 2 is a circuit diagram of a diplexer included in the high-frequency component.

A high-frequency component 10 is a module in which configuration elements are preferably integrated on a multilayer substrate.

The high-frequency component 10 includes a diplexer 1, a switching circuit 2, a switching circuit 3, an LC filter 4, a SAW filter 5, an LC filter 6, and a SAW filter 7.

A first port P1A of the diplexer 1, a second port P4B of the LC filter 4, a second port P5B of the SAW filter 5, a second port P6B of the LC filter 6, and a second port P7B of the SAW filter 7 are each an external connection terminal.

A first port P1A of the diplexer 1 is an antenna port, and is connected to an antenna ANT via a matching capacitor. The second port P4B of the LC filter 4 is connected to a transmission circuit Tx(EGSM) of a low-frequency band via a matching capacitor. The second port P5B (balanced terminals) of the SAW filter 5 is connected to a receiver circuit Rx (EGSM) of a low-frequency band, where a matching reactance element is connected across the balanced terminals of the second port P5B. The second port P6B of the LC filter 6 is connected to a transmission circuit Tx(DCS) of the high-frequency band via a matching capacitor. The second port P7B (balanced terminals) of the SAW filter 7 is connected to a receiver circuit Rx (DCS) of the high-frequency band, where a matching reactance element is connected across the balanced terminals of the second port P7B.

In the high-frequency component 10, the switching circuit 2, the LC filter 4, and the SAW filter 5 define a low-frequency-band circuit, which is the front-end unit for the low-frequency band (EGSM), and the switching circuit 3, the LC filter 6, and the SAW filter 7 define a high-frequency-band circuit, which is the front-end unit for the high-frequency band (DCS).

A first port P2A of the switching circuit 2 is connected to a second port P1B of the diplexer 1, and a first port P3A of the switching circuit 3 is connected to a third port P1C of the diplexer 1. A first port P4A of the LC filter 4 is connected to a second port P2B of the switching circuit 2, and a first port P5A of the SAW filter 5 is connected to a third port P2C of the switching circuit 2. A first port P6A of the LC filter 6 is connected to a second port P3B of the switching circuit 3, and first port P7A of the SAW filter 7 is connected to a third port P3C of the switching circuit 3.

The diplexer 1 is arranged to split an antenna signal into a DCS transmission/reception signal and an EGSM transmission/reception signal. The switching circuit 2 splits an EGSM transmission/reception signal into an EGSM transmission signal and an EGSM reception signal. The LC filter 4 only passes the EGSM transmission signal band, thereby preventing an EGSM reception signal from entering the low-frequency-band transmission circuit Tx(EGSM). The SAW filter 5 only passes the EGSM reception signal band, thereby preventing an EGSM transmission signal from entering the low-frequency-band receiver circuit Rx (EGSM). The LC filter 6 only passes the DCS transmission signal band, thereby preventing an DCS reception signal from entering the high-frequency-band transmission circuit Tx(DCS). The SAW filter 7 only passes the DCS reception signal band, thereby preventing a DCS transmission signal from entering the high-frequency-band receiver circuit Rx (DCS).

FIG. 2 is a circuit diagram of the diplexer 1. The diplexer 1 includes the first port P1A, the second port P1B, the third port P1C, lines Lt1 and Lt2, and capacitors Cc1, Cc2, Ct2, Ct1, and Cu1.

A parallel circuit including the line Lt1 and the capacitor Ct1 is connected between the first port P1A and the second port P1B of the diplexer 1. An end of the parallel circuit adjacent to the second port P1B is grounded through the capacitor Cu1. The line Lt1, the capacitors Ct1, and Cu1 define a low pass filter 110, which is the low-frequency-band filter. The parallel circuit including the line Lt1 and the capacitor Ct1 define a parallel resonant circuit 101A. A low-frequency-band circuit is connected to the second port P1B in a stage subsequent thereto.

The capacitors Cc1 and Cc2 are serially connected between the first port P1A and the third port P1C of the diplexer 1, and the connection node between the capacitors Cc1 and Cc2 is grounded through the line Lt2 and the capacitor Ct2. The capacitors Cc1, Cc2, and Ct2 and the line Lt2 define a high pass filter 102, which is the high-frequency-band filter. The series circuit including the line Lt2 and the capacitor Ct2 define a first series resonant circuit 102A, and the series circuit including the capacitor Cc1, the line Lt2, and the capacitor Ct2 define a second series resonant circuit 102B. A high-frequency-band circuit is connected to the third port P1C in a stage subsequent thereto.

The low pass filter 101 is designed, through adjustment of the impedance of each configuration element thereof, so as to attenuate a DCS transmission/reception signal and pass an EGSM transmission/reception signal. Especially, the parallel resonant circuit 101A is designed, through resonance frequency setting, so as to provide an attenuation pole at 1.9 GHz, which is the center frequency defined in the DCS specification, and a gain drop in the vicinity of 1.9 GHz. Hence the impedance (inductance value) of the line Lt1 and the impedance (capacitance value) of the capacitor Ct1 are adjusted in the design.

The high pass filter 102 is designed, through adjustment of the impedance of each configuration element thereof, so as to attenuate an EGSM transmission/reception signal and pass a DCS transmission/reception signal. Especially, the series resonant circuit 102A is designed, through resonance frequency setting, so as to provide an attenuation pole at 900 MHz, which is the center frequency defined in the EGSM specification, and a gain drop in the vicinity of 900 MHz. Hence the inductance value of the line Lt2 and the capacitance value of the capacitor Ct2 are adjusted in the design.

In the SAW filter 7 used in the high-frequency component 10, impedance matching is not realized for frequency bands other than the passband. Hence, a signal is reflected in the connection portion of the SAW filter 7 in frequency bands other than the passband, causing new resonance in the high-frequency-band filter. Specifically, series resonance occurs at a resonance frequency that depends on the impedances of the line Lt2 and the capacitor Ct2 that define the first series resonant circuit 102A of the high pass filter 102, and the impedance of the capacitor Cc1. These elements define the second series resonant circuit 102B.

This series resonance, if no corrective action is taken, causes an unfavorable influence on the transmission characteristic of the low-frequency-band side, thereby causing an undesired attenuation pole to be generated in the low-frequency-band transmission characteristic. Hence, in various preferred embodiments of the present invention, design is performed such that the attenuation pole in the low-frequency-band transmission characteristic caused by the resonance of the second series resonant circuit 102B is adjusted so as to be set near the second harmonic frequency of the center frequency defined in the EGSM specification or near the center frequency defined in the DCS specification.

Figure 3A:
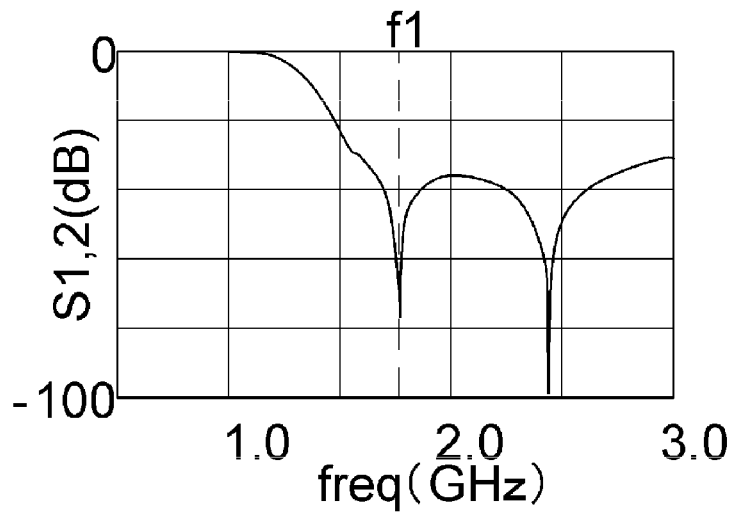
FIGS. 3A-3C are diagrams explaining transmission characteristics of a low-frequency-band filter including an antenna port.
Figure 3B:
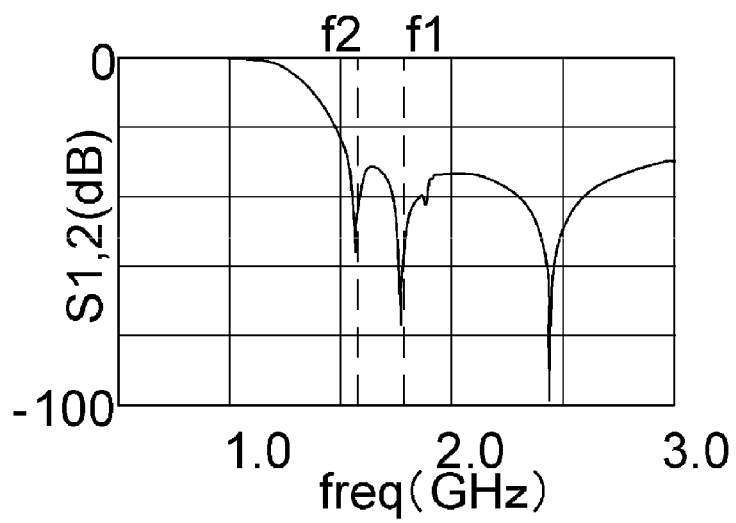
Figure 3C:
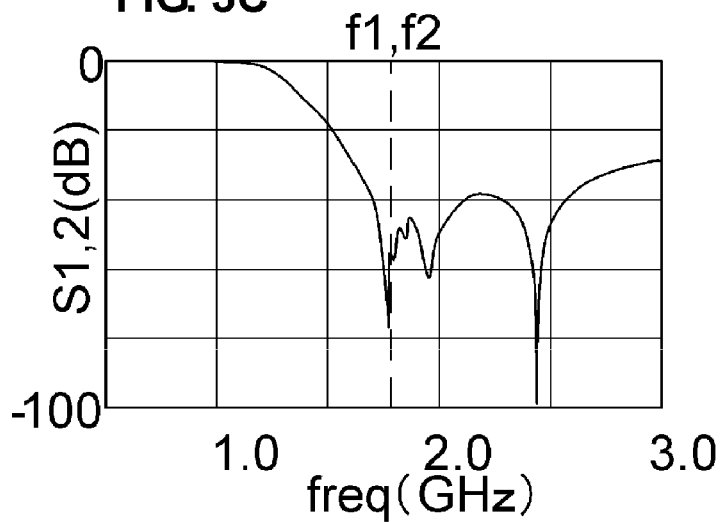

Hereinafter, referring to FIGS. 3A-3C, the transmission characteristic between the antenna port P1A and the second port P1B of the diplexer is described. FIGS. 3A-3C show examples of transmission characteristics including an example of the present preferred embodiment and a comparative example.

FIG. 3A shows a comparative example in which the SAW filter 7 is not provided on the high-frequency-band side, and the connection point of the SAW filter 7 is terminated with an impedance of 50Ω, which is the characteristic impedance of the circuit. In the description here, this example is treated as a substantially ideal transmission characteristic.

In this case, the low pass filter 110 has an attenuation pole f1 located at 1.8 GHz, which is the specification-defined center frequency of the high-frequency-band, and a region of frequencies lower than the attenuation pole f1 becomes a passband. The attenuation pole f1 is set by the resonance frequency of the parallel resonant circuit 101A of the low pass filter 101.

FIG. 3B shows a comparative example showing a degraded transmission characteristic in a configuration which does not employ the present invention, in the case in which a high-frequency-band circuit is provided with the SAW filter 7 that causes significant impedance mismatching outside of the passband.

Also in this case, the attenuation pole f1 is set so as to be located, for attenuation, near 1.8 GHz, which is the specification-defined center frequency of the high-frequency band. Here, since the high-frequency-band circuit is provided with the SAW filter 7 in which impedance matching is not realized for frequency bands outside this passband, a signal reflection occurs in the connection portion of the SAW filter 7, causing new resonance in the high pass filter 102.

Because of the resonance of the second series resonant circuit 102B, an undesired attenuation pole f2 appears in the low-frequency-band transmission characteristic, thereby degrading the attenuation characteristic. In the illustrated example, the undesired attenuation pole f2 appears near a frequency of 1.6 GHz.

FIG. 3C shows a comparative example of a configuration which employs a preferred embodiment of the present invention, i.e., the case showing an improved transmission characteristic by appropriately setting the resonance frequency of the second series resonant circuit 102B of the high pass filter 102, when the SAW filter 7, in which impedance matching is not realized for frequency bands other than the passband, is provided in the high-frequency-band circuit and the frequency bands other than the passband are not terminated with 50Ω.

In this case, the undesired attenuation pole f2 generated in the transmission characteristic of the low-frequency-band due to the resonance of the second series resonant circuit 102B is set so as to be located near 1.8 GHz and to substantially overlap the attenuation pole f1 generated due to the resonance of the low pass filter 101A. In this manner, an undesired attenuation pole generated due to the resonance of the second series resonant circuit 102B is removed.

Note that, here, since the second harmonic frequency of the specification-defined center frequency of the low-frequency band coincides with the specification-defined center frequency of the high-frequency band, the attenuation pole of the low pass filter 101 is set as described above; however, when the second harmonic frequency of the specification-defined center frequency of the low-frequency band does not coincide with the specification-defined center frequency of the high-frequency band, the attenuation pole may be set to either the second harmonic frequency of the specification-defined center frequency of the low-frequency band or the specification-defined center frequency of the high-frequency band.

When this frequency falls within the passband of the SAW filter 7, the resonance of the second series resonant circuit 102B is not generated, since the characteristic impedance of the SAW filter 7 in the passband is near 50Ω. Hence, it is preferable in this case that the resonance frequency of the second series resonant circuit 102B be appropriately set outside of the passband of the SAW filter 7.

Hereinafter, the configurations of the switching circuits 2 and 3, and the LC filters 4 and 6 are described.

Figure 4A:
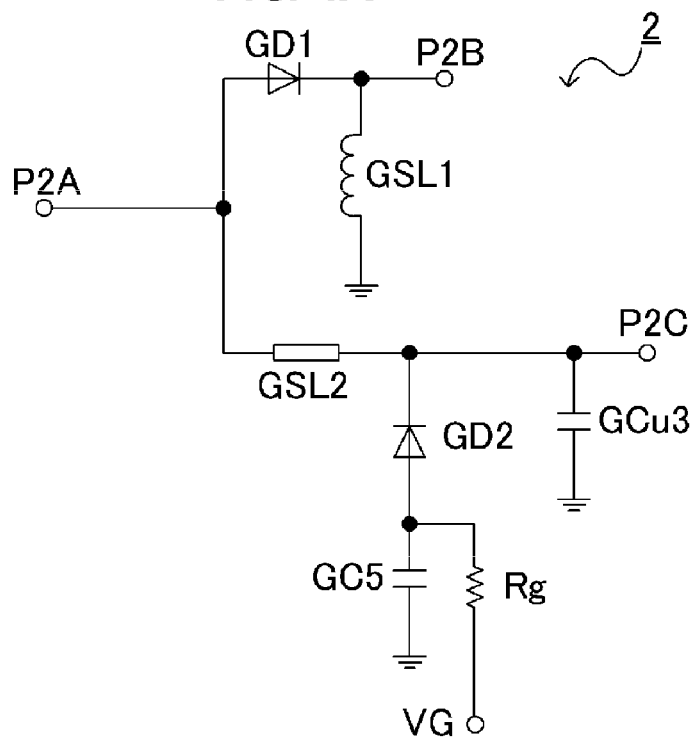
FIGS. 4A and 4B are circuit diagrams of a switching circuit according to a preferred embodiment of the present invention.

FIG. 4A is a circuit diagram of the switching circuit 2. The switching circuit 2 switches a transmission/reception signal in the low-frequency band between a transmission signal and a reception signal.

The switching circuit 2 includes the first port P2A, the second port P2B, the third port P2C, a switching control terminal VG, diodes GD1 and GD2, an inductor GSL1, a line GSL2, capacitors GC5 and GCu3, and a resistor Rg.

The diode GD1 is connected between the first port P2A and the second port P2B, with the anode thereof being adjacent to the first port P2A. An end of the diode GD1 adjacent to the second port P2B, i.e., the cathode is grounded through the inductor GSL1, which is a choke coil.

The line GSL2 is connected between the first port P2A and the third port P2C, and the cathode of the diode GD2 is connected to an end of the line GSL2 adjacent to the third port P2C. The end of the line GSL2 adjacent to the third port P2C is also grounded through the capacitor GCu3. The anode of the diode GD2 is grounded through the capacitor GC5, and the switching control terminal VG is provided at the connection node between the anode of the diode GD2 and the capacitor GC5 via the resistor Rg.

Figure 4B:
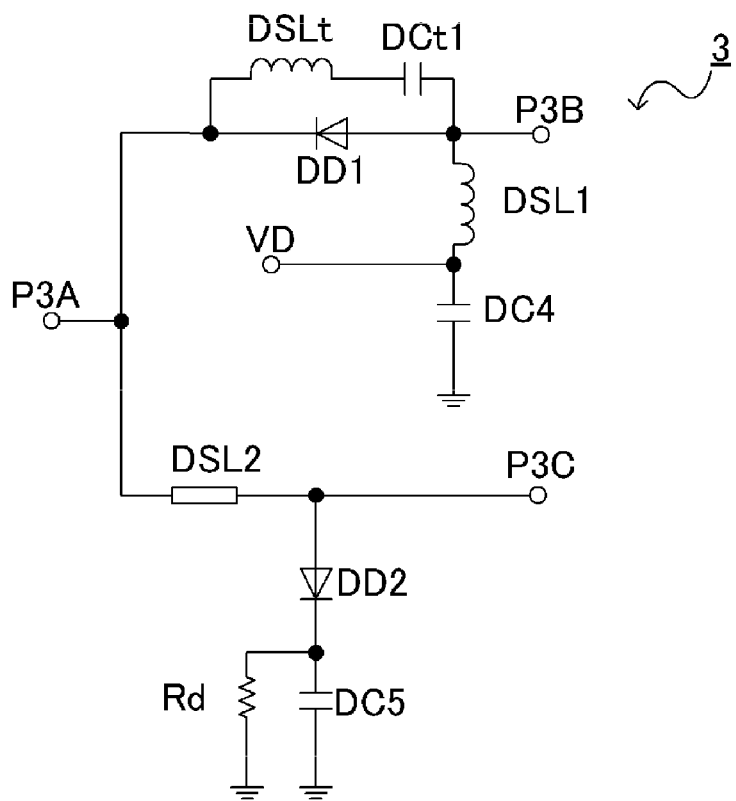

FIG. 4B is a circuit diagram of the switching circuit 3. The switching circuit 3 switches a transmission/reception signal in the high-frequency band between a transmission signal and a reception signal.

The switching circuit 3 includes the first port P3A, the second port P3B, the third port P3C, a switching control terminal VD, diodes DD1 and DD2, inductors DSLt and DSL1, a line DSL2, capacitors DCt1, C, and DC5, and a resistor Rd.

The diode DD1 is connected between the first port P3A and the second port P3B with the cathode being adjacent to the first port P3A. A series circuit including the inductor DSLt and the capacitor DCt1 is connected in parallel to the diode DD1. Further, an end of the diode DD1 adjacent to the second port P3B, i.e., the anode is grounded through the inductor DSL1, which is a choke coil, and the capacitor DC4. The switching control terminal VD is provided at the connection node between the inductor DSL1 and the capacitor DC4.

The line DSL2 is connected between the first port P3A and the third port P3C, and the anode of the diode DD2 is connected to an end of the line DSL2 adjacent to the third port P3C, and the cathode of the diode DD2 is grounded through the capacitor DC5. The connection node between the diode DD2 and the capacitor DC5 is grounded through the resistor Rd.

Figure 5A:
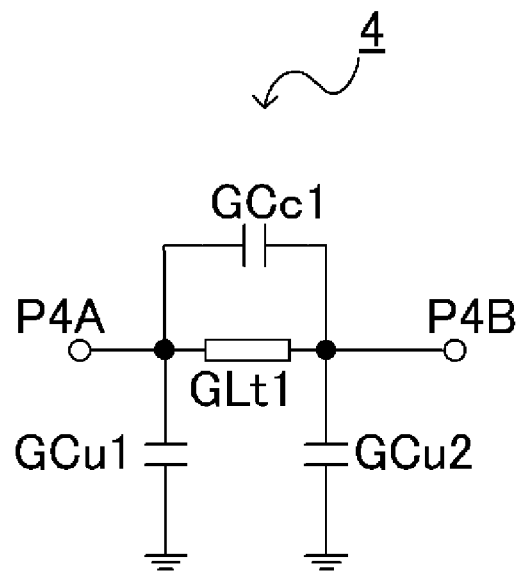
FIGS. 5A and 5B are circuit diagrams of an LC filter according to a preferred embodiment of the present invention.

FIG. 5A is a circuit diagram of the LC filter 4. The LC filter 4 attenuates the second harmonic wave and the third harmonic wave of a transmission signal in the low-frequency band.

The LC filter 4 includes the first port P4A, the second port P4B, a line GLt1, and capacitors GCc1, GCu1, and GCu2.

The line GLt1 is connected between the first port P4A and the second port P4B, and the capacitor GCc1 is connected in parallel to the line GLt1. The capacitor GCu1 is connected between the first port P4A of the line GLt1 and the ground, and the capacitor GCu2 is connected between the second port P4B of the line GLt1 and the ground.

Figure 5B:
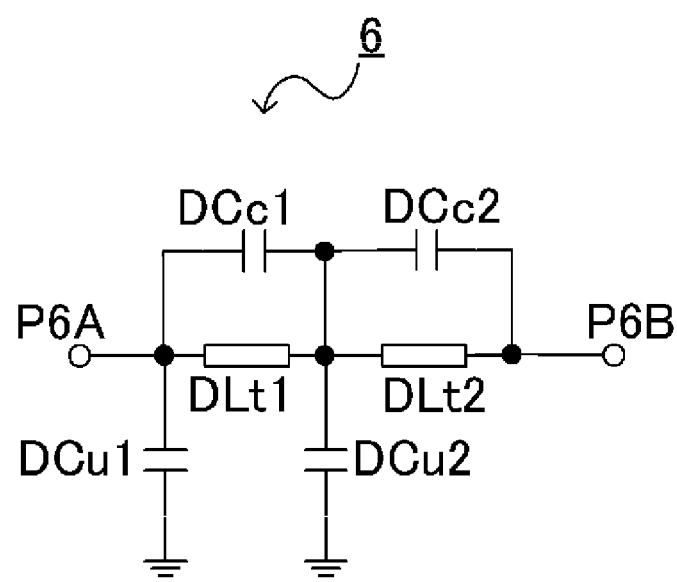

FIG. 5B is a circuit diagram of the LC filter 6. The LC filter 6 attenuates the second harmonic wave and the third harmonic wave of a transmission signal in the high-frequency band.

The LC filter 6 includes the first port P6A, the second port P6B, lines DLt1 and DLt2, and capacitors DCc1, DCu1, DCu2, and DCc2.

A parallel circuit including the line DLt1 and the capacitor DCc1 and a parallel circuit including the line DLt2 and the capacitor DCc2 are serially connected between the first port P6A and the second port P6B. One end of the parallel circuit including the line DLt1 and the capacitor DCc1 adjacent to the first port P6A is grounded through the capacitor DCu1, and the other end nearer to the second port P6B is grounded through the capacitor DCu2.

The circuit configurations of the SAW filter 5 and the SAW filter 7 used may be general configurations, and the description thereof is omitted.

A high-frequency component according to the present preferred embodiment is configured using the above-described circuits. Although a high-frequency component according to the present preferred embodiment defines the front-end unit of a mobile communication apparatus that supports dual bands of 900-MHz-band EGSM and 1.8-GHz-band DCS, the present invention can be realized in any combination of communications systems (for example, 850-MHz-band EGSM and 1.9-GHz-band PCS).

Next, referring to FIGS. 6 to 9, an example structure of the high-frequency component according to the present preferred embodiment which is preferably integrated on a multilayer substrate formed by stacking a plurality of ceramic sheets will be described.

Figure 6:
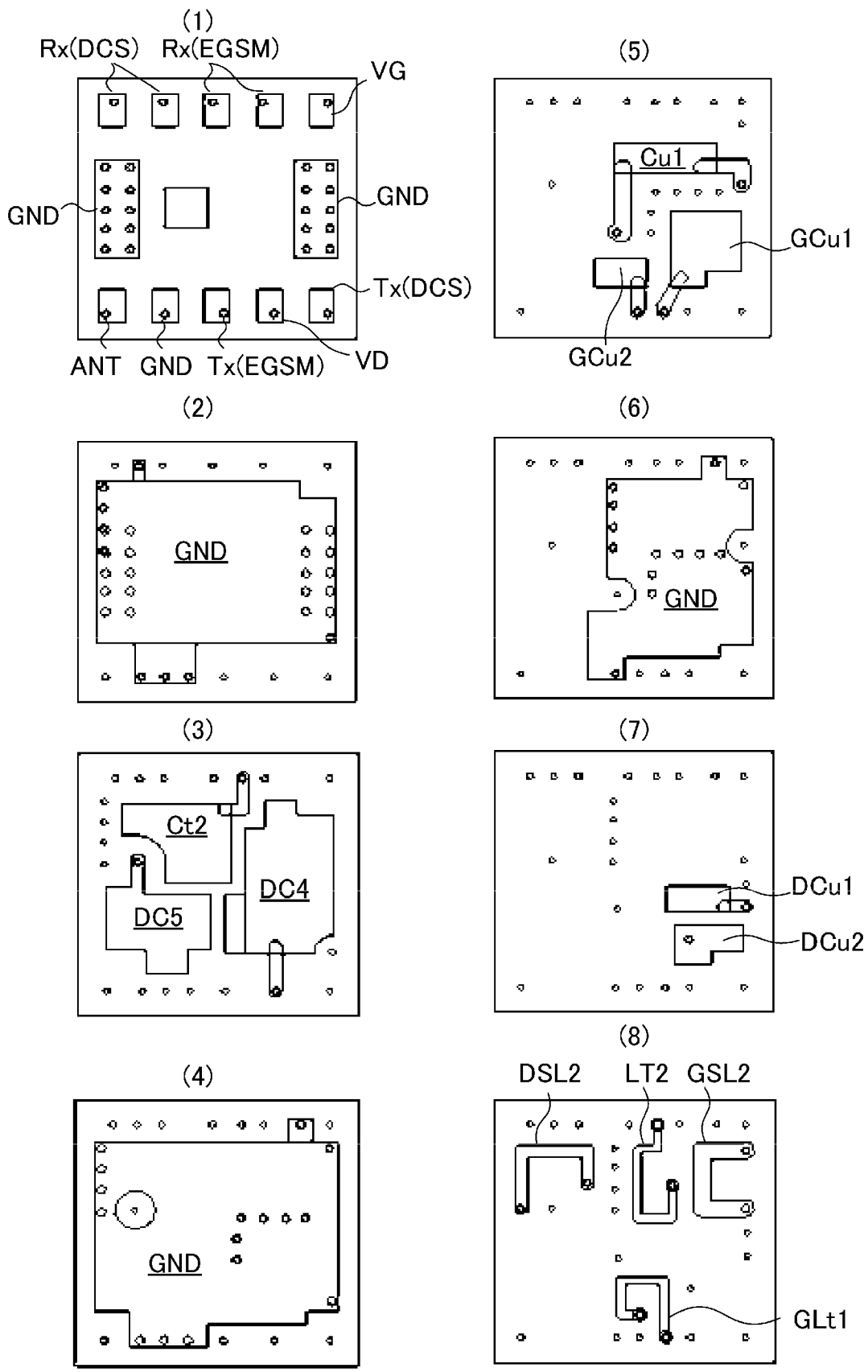
FIG. 6 illustrates stacking in the high-frequency component according to a preferred embodiment of the present invention.
Figure 7:
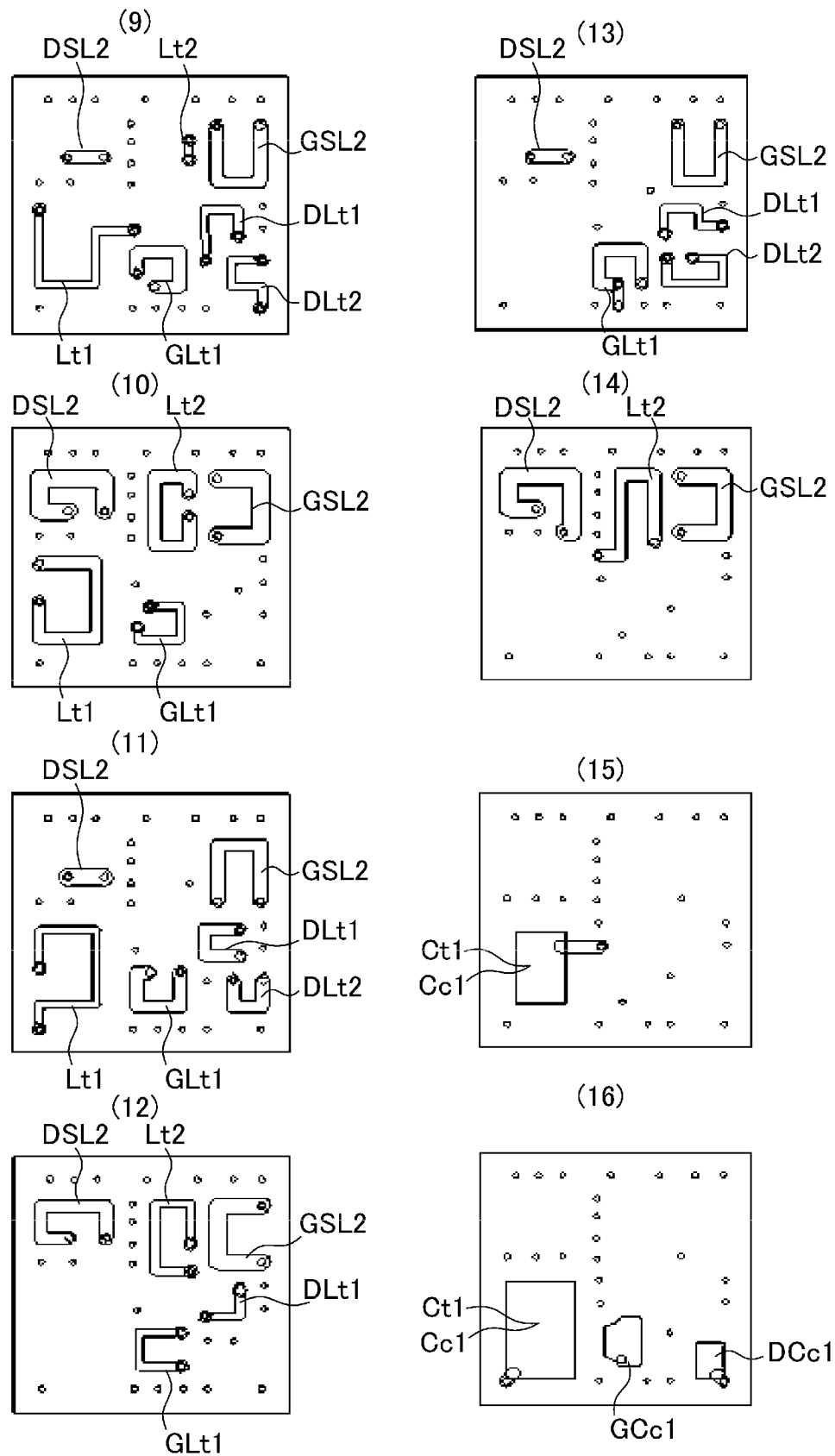
FIG. 7 illustrates stacking in the high-frequency component according to a preferred embodiment of the present invention.
Figure 8:
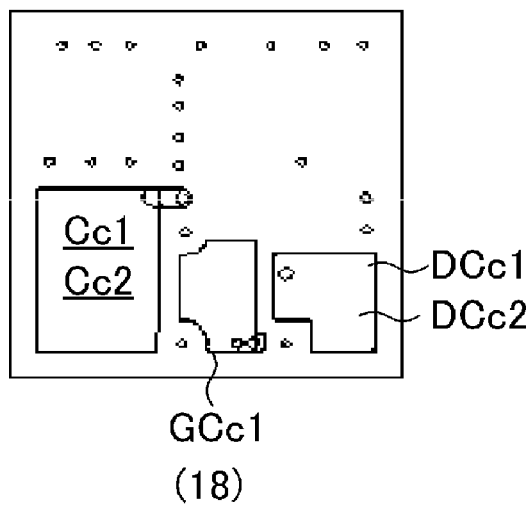
FIG. 8 illustrates stacking in the high-frequency component according to a preferred embodiment of the present invention.
Figure 8:
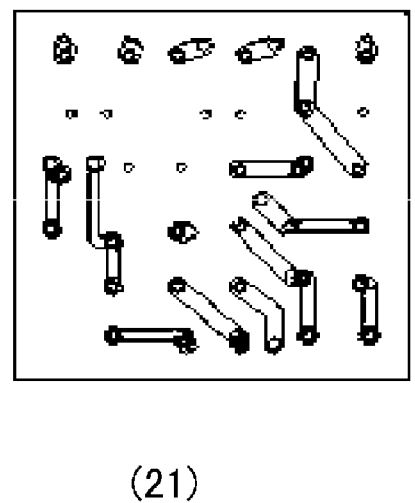
Figure 8:
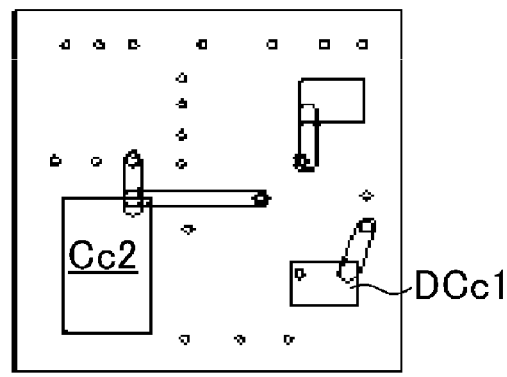
Figure 8:
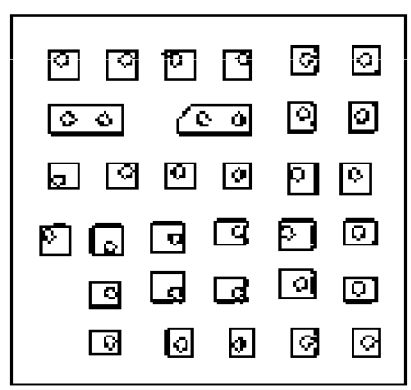
Figure 8:
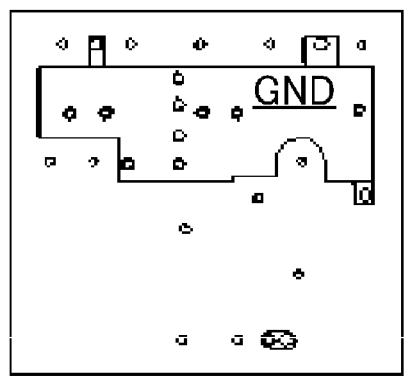

FIGS. 6 to 8 are plan views of semiconductor patterns in respective layers. FIG. 6 (1) shows the lowermost layer, and FIG. 8 (21) shows the uppermost layer. For convenience of illustration, the layers are illustrated using three figures, FIGS. 6 to 8. The reference numerals of portions shown in FIGS. 6 to 8 correspond to those of the circuits shown in FIGS. 2, 4 and 5. In these figures, "GND" denotes a ground electrode.

Referring to FIG. 1, GND is a ground terminal. Other terminals are external connection terminals shown in FIG. 1, where letters denote the names of devices to which the external connection terminals are connected, when the devices are transmission circuits or receiver circuits.

Referring to FIGS. 6 and 7, the line DSL2 is arranged to extend across layers (8) to (13), and the line Lt2 is arranged to extend across layers (8) to (14). The line GSL2 is arranged to extend across layers (8) to (13). Likewise, the strip line Glt1 is arranged to extend across layers (8) to (13). By forming strip lines having predetermined electrical lengths, used in a high-frequency switch, across nearly the same layers in this manner, the strip lines can be formed within a limited area and within a limited number of layers, whereby an increase in the chip size is limited even when the scale of the whole circuits increases.

Figure 9:
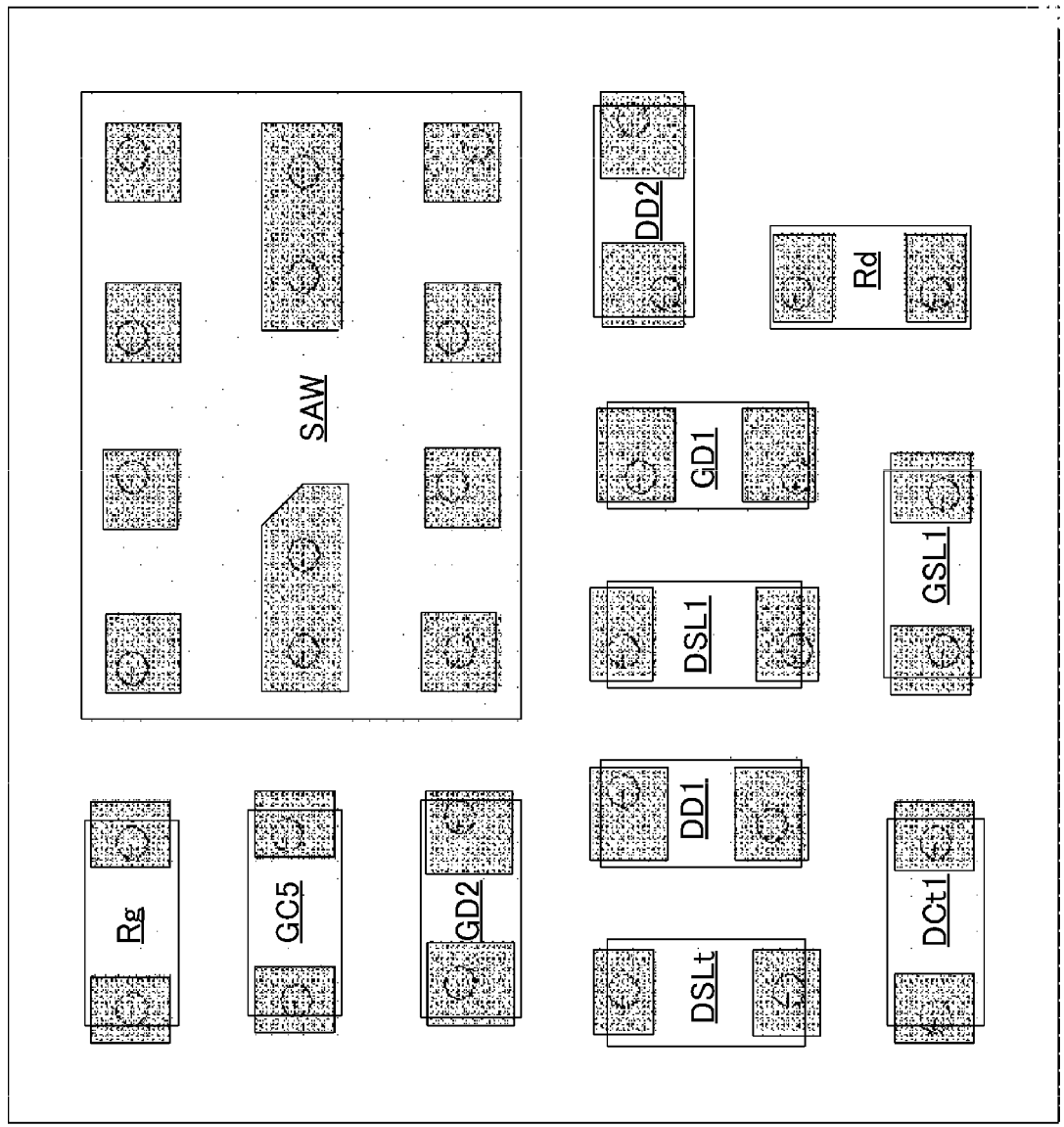
FIG. 9 illustrates stacking in the high-frequency component according to a preferred embodiment of the present invention.

FIG. 9 shows a state in which each chip component is mounted on the uppermost surface of the stack. Here, the SAW filter is of the dual type which includes the SAW filter 5 for EGSM and the SAW filter 7 for DCS shown in FIG. 1.

Note that, in the high pass filter of a diplexer in the present preferred embodiment, a capacitor is preferably used for a reactance element that defines the second series resonant circuit together with the first series resonant circuit; however, a coil or a line can also be used instead of this capacitor.

Next, a second preferred embodiment of the present invention will be described. A high-frequency component of the second preferred embodiment preferably has substantially the same configuration as that of the high-frequency component of the above-described preferred embodiment; however it is different from the above preferred embodiment in the characteristics of configuration elements of the low pass filter in the diplexer, and in the characteristic of a SAW filter provided in the circuit of the low-frequency-band (EGSM) side.

In the SAW filter 5 used in the present preferred embodiment, impedance matching is not realized for frequency bands other than the passband. Hence, a signal is reflected in the connection portion of the SAW filter 5 in frequency bands other than the passband, causing new resonance in the low-frequency-band filter. Specifically, resonance occurs at a resonance frequency that depends on the impedances of the three configuration elements of the low pass filter 101, i.e., the line Lt1, the capacitor Ct1, and the capacitor Cu1.

This resonance due to the line Lt1, the capacitor Ct1, and the capacitor Cu1, if no corrective action is taken, causes unfavorable influence on the high-frequency-band transmission characteristic, thereby causing an undesired attenuation pole to be generated in the high-frequency-band transmission characteristic. Hence, in various preferred embodiments of the present invention, design is performed such that the attenuation pole in the high-frequency-band transmission characteristic caused by the resonance due to the line Lt1, the capacitor Ct1, and the capacitor Cu1 is adjusted so as to be set near the center frequency defined in the EGSM specification. In this manner, by making the frequency of the resonance in a low pass filter, which is newly generated due to impedance mismatching of a SAW filter provided in a low-frequency-band-(EGSM) circuit, to be the same as the frequency of a predetermined attenuation pole in the high-frequency-band-(DCS) frequency characteristic, an undesired attenuation pole is prevented from appearing in the high-frequency-band transmission characteristic. Therefore, a desired high-frequency-band transmission characteristic is obtained even when impedance mismatching exists in the low-frequency-band circuit, by using a general configuration as is, for example, a configuration that does not require a phase adjustment circuit or a multistage high pass filter.

Further, various preferred embodiments of the present invention can be applied to a high-frequency component that supports multiple bands other than dual bands, such as triple bands or quadruple bands.

Figure 10:
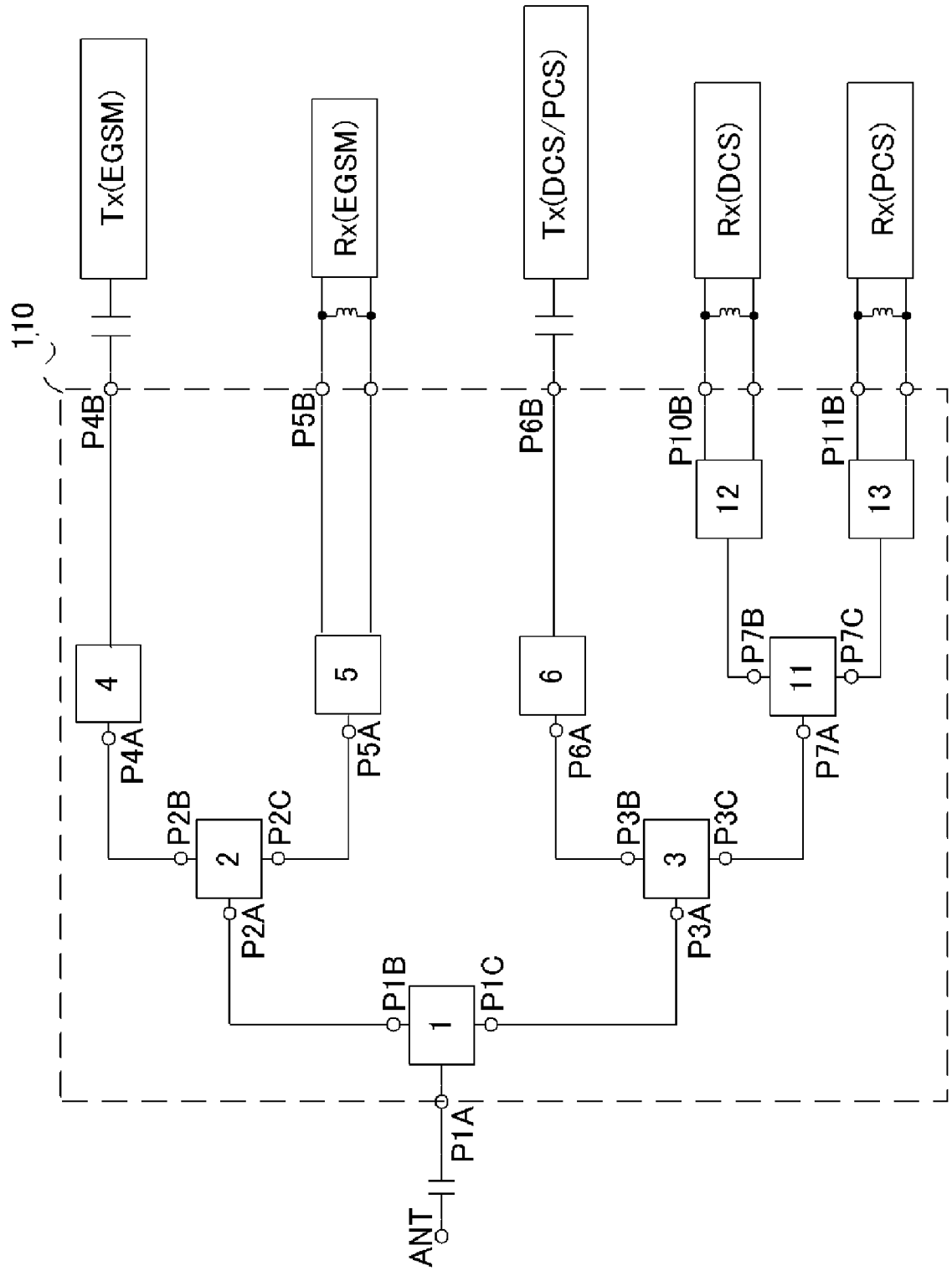
FIG. 10 is a block diagram of a high-frequency component supporting dual bands according to another preferred embodiment of the present invention.
Figure 11:
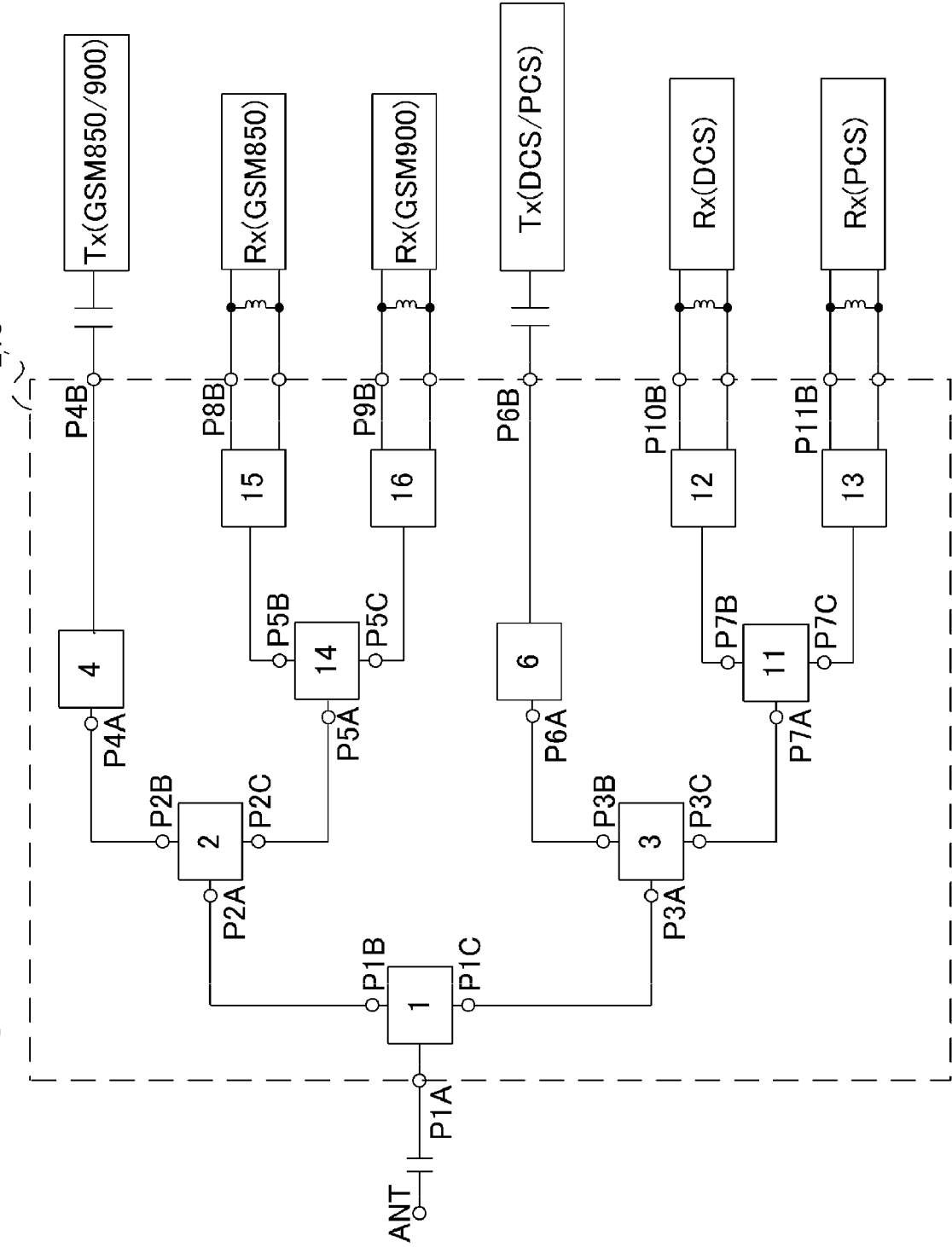
FIG. 11 is a block diagram of a high-frequency component supporting quadruple bands according to still another preferred embodiment of the present invention.

FIG. 10 shows a block diagram of a high-frequency component that supports triple bands, and FIG. 11 shows a block diagram of a high-frequency component that supports quadruple bands.

A high-frequency component 110 shown in FIG. 10 supports triple bands corresponding to 90-MHz-band EGSM, 1.8-GHz-band EGSM, and 1.9-GHz-band PCS. In this case, a switching circuit 11 is further provided in a stage subsequent to the switching circuit 3 on the receiver circuit side thereof. To the switching circuit 11 are connected a DCS receiver circuit Rx (DCS) via a SAW filter 12 and a PCS receiver circuit RX(PCS) via a SAW filter 13. Also in this case, by appropriately setting each element of the diplexer 1, the transmission-characteristic degradation of the low-frequency band due to undesired resonance is prevented and suppressed even when impedance mismatching of the SAW filter 12 or the SAW filter 13 occurs.

A high-frequency component 210 shown in FIG. 11 supports quadruple bands corresponding to 850-MHz-band EGSM (GSM850), 900-MHz-band EGSM, 1.8-GHz-band EGSM, and 1.9-GHz-band PCS. In this case, a switching circuit 14 is further provided in a stage subsequent to the switching circuit 2 on the receiver circuit side thereof. To the switching circuit 14 are connected a GSM850 receiver circuit Rx (GSM850) via a SAW filter 15 and a GSM900 receiver circuit Rx (GSM900) via a SAW filter 16. Also in this case, by appropriately setting each element of the diplexer 1, the transmission-characteristic degradation of the low-frequency band due to undesired resonance is prevented and suppressed even when the impedance mismatching of the SAW filter 12 or the SAW filter 13 of the high-frequency-band circuit occurs.

As described above, preferred embodiments of the present invention can be carried out irrespective of the number of communications systems and can be applied, in various ways, to high-frequency components that are provided with a switchplexer having an antenna port.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A high-frequency component, comprising:
    a diplexer including a high-frequency-band filter and a low-frequency-band filter connected in parallel to an antenna port, the high-frequency-band filter being arranged to pass a transmission/reception signal in a high-frequency band and attenuate a transmission/reception signal in a low-frequency band among transmission/reception signals of a plurality of communications systems each having a different frequency band, and the low-frequency-band filter being arranged to pass a transmission/reception signal in the low-frequency band and attenuate a transmission/reception signal in the high-frequency band, among the transmission/reception signals of the plurality of communications systems;
    a high-frequency-band circuit serially connected to the high-frequency-band filter of the diplexer; and
    a low-frequency-band circuit serially connected to the low-frequency-band filter of the diplexer; wherein
    the high-frequency-band filter includes a first series resonant circuit, one end of which is connected to a connection node between the antenna port and the high-frequency-band circuit and the other end of which is grounded, and a second series resonant circuit including a reactance element connected serially between the antenna port and the high-frequency-band circuit and including the first series resonant circuit;
    a resonance frequency of the first series resonant circuit is a trap frequency of a transmission/reception signal in the low-frequency band, in the frequency characteristic of the high-frequency-band filter; and
    a resonance frequency of the second series resonant circuit is substantially the same as a frequency of a predetermined attenuation pole in the frequency characteristic of the low-frequency-band filter.

2. The high-frequency component according to claim 1, wherein the resonance frequency of the second series resonant circuit is the same as a trap frequency of a transmission/reception signal in the high-frequency band, in the frequency characteristic of the low-frequency-band filter.

3. The high-frequency component according to claim 1, wherein the resonance frequency of the second series resonant circuit is the same as a harmonic frequency of a transmission/reception signal in the low-frequency band.

4. The high-frequency component according to claim 1, wherein the high-frequency-band circuit is provided with a mismatching element that causes impedance mismatching.

5. The high-frequency component according to claim 4, wherein the mismatching element includes a filter.

6. The high-frequency component according to claim 1, wherein the high-frequency-band circuit includes a switching circuit arranged to split a transmission/reception signal in the high-frequency band between a transmission signal port and a reception signal port, and a SAW filter connected to the reception signal port of the switching circuit.

7. The high-frequency component according to claim 1, wherein the high-frequency-band circuit includes a first switching circuit that is arranged to split a transmission/reception signal in the high-frequency band between a transmission signal port and a reception signal port, a second switching circuit that is connected to the reception signal port of the first switching circuit and is arranged to split the reception signal in the high-frequency band further into reception signals in two frequency bands, and a SAW filter connected to the second switching circuit in a stage subsequent thereto.

* * * * *